(12) United States Patent
Abdo et al.

(10) Patent No.: US 7,445,967 B2
(45) Date of Patent: Nov. 4, 2008

(54) METHOD OF PACKAGING A SEMICONDUCTOR DIE AND PACKAGE THEREOF

(75) Inventors: David F. Abdo, Scottsdale, AZ (US); Alexander J. Elliott, Tempe, AZ (US); Lakshminarayan Viswanathan, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 187 days.

(21) Appl. No.: 11/336,368

(22) Filed: Jan. 20, 2006

(65) Prior Publication Data
US 2007/0172990 A1    Jul. 26, 2007

(51) Int. Cl.
*H01L 21/50* (2006.01)
*H01L 21/48* (2006.01)
*H01L 21/44* (2006.01)

(52) U.S. Cl. .................................................. 438/123
(58) Field of Classification Search .................. 438/123
See application file for complete search history.

(56) References Cited

U.S. PATENT DOCUMENTS

| 5,877,555 | A | 3/1999 | Leighton et al. |
| 5,886,396 | A | 3/1999 | Carney et al. |
| 6,072,238 | A | 6/2000 | Viswanathan et al. |
| 6,118,175 | A | 9/2000 | Anderson et al. |
| 6,198,163 | B1 | 3/2001 | Crowley et al. |
| 6,261,868 | B1 * | 7/2001 | Miller et al. ................ 438/123 |
| 6,396,130 | B1 | 5/2002 | Crowley et al. |
| 6,451,627 | B1 | 9/2002 | Coffman |
| 2004/0022016 | A1 * | 2/2004 | Mosna et al. ................ 361/683 |
| 2004/0032011 | A1 | 2/2004 | Warner et al. |
| 2005/0191793 | A1 | 9/2005 | Brennan et al. |

OTHER PUBLICATIONS

International Search Report and Written Opinion.

\* cited by examiner

*Primary Examiner*—Luan Thai
(74) *Attorney, Agent, or Firm*—Bryan Cave LLP

(57) ABSTRACT

A method of packaging a semiconductor die includes the steps of providing a flange (110), coupling one or more active die (341) to the flange with a lead-free die attach material (350), staking a leadframe (120) to the flange after coupling the one or more active die to the flange, electrically interconnecting the one or more active die and the leadframe with an interconnect structure (470), and applying a plastic material (130) over the flange, the one or more active die, the leadframe, and the interconnect structure.

20 Claims, 3 Drawing Sheets

METHOD OF PACKAGING A SEMICONDUCTOR DIE AND PACKAGE THEREOF

FIELD OF THE INVENTION

This invention relates generally to semiconductor components, and relates more particularly to packaging for semiconductor components.

BACKGROUND OF THE INVENTION

Semiconductor die or chips are encapsulated in a semiconductor package for protection from damage by external stresses and to provide a system for carrying electrical signals to and from the chips. Many different types of semiconductor packages exist, including dual-in-line packages, pin grid array packages, tape-automated bonding (TAB) packages, multi-chip modules (MCMs), and power packages. One type of power package is a high power package that is used for a high power semiconductor device and that is capable of dissipating greater than ten watts of power.

Typically, these power packages use a relatively high resistivity die attach materials that have a high lead content, a large thickness, and a low thermal conductivity of approximately twenty to thirty watts per meter Kelvin (w/m-K). Each of these characteristics contribute to heat transfer problems during device operation. Radio frequency and other high frequency power packages also typically have an air cavity enclosed by ceramic components, which are expensive. Lower cost high frequency encapsulated power packages are typically limited to a single semiconductor chip per package, which requires: (1) matching components to be located on the same chip as the high power semiconductor device, which can result in lossy devices with lower electrical performance; or (2) matching components and/or other components to be located on one or more different chips in different packages and requires a larger footprint or a larger amount of space in the final product for multiple packages.

Accordingly, a need exists for a low cost package for a high power semiconductor device that has improved thermal conductivity for improved reliability, that is less expensive than air cavity packages, that can be used to package multiple semiconductor chips in a single package, and that is compatible with high frequency applications above approximately three hundred MegaHertz (MHz).

BRIEF DESCRIPTION OF THE DRAWINGS

The invention will be better understood from a reading of the following detailed description, taken in conjunction with the accompanying figures in the drawings in which.

Figure 1:
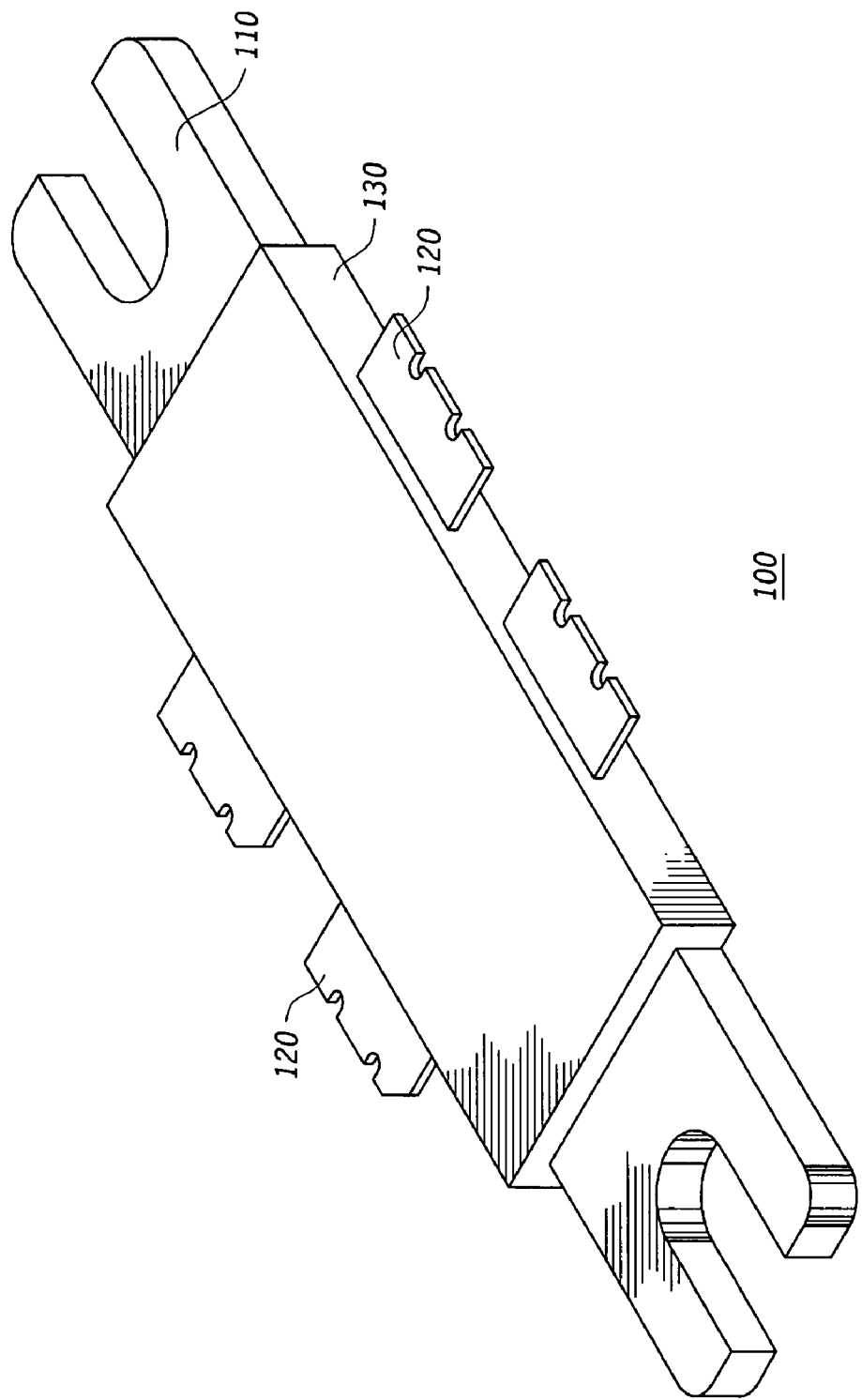
FIG. 1 illustrates an isometric view of a package for a high power semiconductor device in accordance with an embodiment of the invention.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical, mechanical, chemical, or other manner.

DETAILED DESCRIPTION OF EXEMPLARY EMBODIMENTS

FIG. 1 illustrates an isometric view of a package 100 for a semiconductor die. Package 100 includes a flange 110, one or more active die (not illustrated in FIG. 1) coupled to flange 110 with a lead-free die attach material (not illustrated in FIG. 1), a leadframe 120 staked or otherwise attached in a precise manner to flange 110, an interconnect structure (not illustrated in FIG. 1) electrically coupling together leadframe 120 and the one or more active die, and a plastic material 130 over flange 110, the one or more active die, leadframe 120, and the interconnect structure. In some embodiments where the active die include a high power semiconductor device, package 100 can be referred to as a high power semiconductor component.

As explained in more detail below, package 100 is more environmentally friendly, has better thermal conductivity, has better reliability, is less expensive, and requires less space than typical high power packages. More specifically, the lead-free die attach material provides package 100 with its more environmentally friendly characteristic, and the use of, for example, a gold silicon die attach and a copper or other non-ceramic flange provides package 100 with its better thermal conductivity and lowered thermal resistivity, which produces improved reliability characteristics over the ceramic-based, air cavity packages. Additionally, the exemplary copper flange and exemplary plastic overmolded material allow package 100 to be less expensive than the ceramic-based packages. Furthermore, the ability to package more than one semiconductor chip within the package permits package 100 to either: (1) have a smaller footprint and occupy less space within a final product compared to a typical two package solution; or (2) have a less lossy and improved electrical performance compared to a typical single integrated chip solution.

Figure 2:
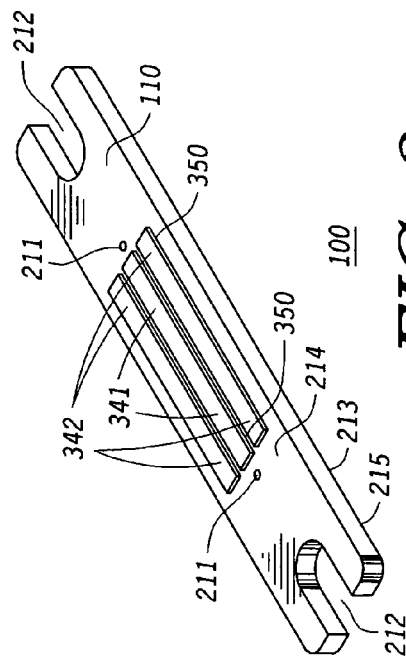
FIG. 2 illustrates an isometric view of the package of FIG. 1 during an initial step of the packaging process in accordance with an embodiment of the invention.

Turning to the next drawing, FIG. 2 illustrates, in general, an isometric view of package 100 in FIG. 1 during an initial step of the packaging process. More specifically, FIG. 2 illustrates an isometric view of flange 110. Flange 110 serves as a subsequent mounting surface for the semiconductor chips or die and can be part of a leadframe-type structure where multiple flanges are coupled together during this stage of the packaging process.

In some embodiments, flange 110 also serves as a heatsink and, in such embodiments, can be referred to as a heatsink. When flange 110 serves as a heat sink, flange 110 can be comprised of a high thermal conductivity material such as, for example, copper. In this embodiment, flange 110 can have a high thermal conductivity of greater than approximately three hundred fifty w/m-K.

As illustrated in FIG. 2, flange 110 includes two or more features 211. As illustrated in the drawings, features 211 can be through-holes in flange 110, but in a different embodiment, features 211 can extend only part of the way through flange 110. In yet another embodiment, features 211 can be a protrusion that rises above the top surface of flange 110. As an example, each of features 211 can have a cylindrical cross-section and can be approximately five hundred micrometers in diameter or can have a diameter varying from approximately four hundred to one thousand micrometers. As another example, each of features 211 can have a constant or varying rectangular cross-section through the thickness of flange 110. One skilled in the art will understand that flange 110 can include more or less than two features and that the one or more features can have a variety of shapes and can be arranged in a variety of configurations. Regardless of their shapes and configurations, features 211 can serve as a region for precisely staking the leadframe to flange 110 and can also serve as a mold lock for the subsequent overmolded plastic material. Flange 110 can also include other mold locks.

As also illustrated in FIG. 2, flange 110 can include features 212. Features 212 can be located at opposite ends of flange 110 and can be used for attaching package 100 to a printed circuit (PC) board, another heatsink, or other system or product. FIG. 2 depicts two features having a particular shape, but the specific quantity and shape of features 212 may vary.

In one embodiment, flange 110 can comprise two or more layers or materials such as, for example, materials 213 and 214. In this embodiment, material 214 can be more ductile and/or more thermally conductive than material 213, and material 213 can be more rigid than material 214. In this manner, flange 110 can be a composite flange with a top surface that is better suited for improving die integrity and a bottom surface that is better suited for improving the mechanical integrity of package 100. As an example, material 213 can be a material known in the art as "copper 151," and material 214 can be a material known in the art as "copper 102."

Regardless of the number of layers that flange 110 contains, however, flange 110 can be thinner than other flanges or heatsinks because of the use of an overmolded plastic package. As an example, flange 110 can have a thickness of approximately 33 mils or 0.84 millimeters. As part of this embodiment or as part of a different embodiment, material 214 can be selectively plated with a suitable metal such as, for example, gold to be compatible with a subsequent die attach step. In this embodiment, the remainder of flange 110 is not coated with gold to improve the subsequent adhesion between plastic material 130 and flange 110.

In the same or a different embodiment, flange 110 can include a recess 215 at a perimeter of its bottom surface (i.e., material 213). For improved package integrity, a subsequently molded packaging material can be molded over the top surface of flange 110, over the side surfaces of flange 110, and in recess 215 such that the packaging material is flush or co-planar with the bottom surface of flange 110. In this manner, package 100 can be a surface-mountable package.

Figure 3:
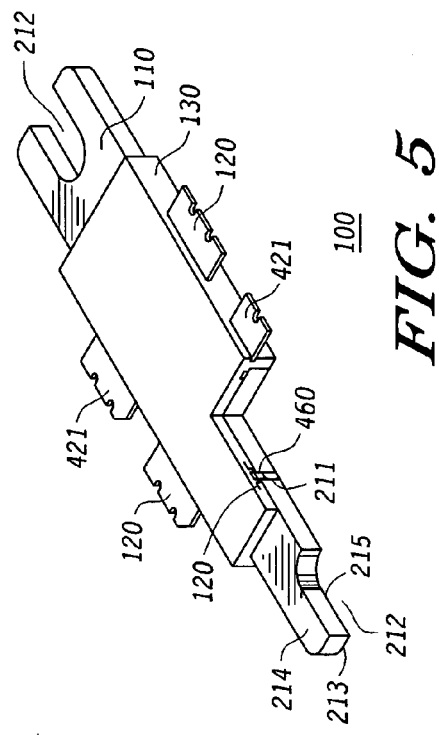
FIG. 3 illustrates an isometric view of the package of FIG. 2 during a subsequent step of the packaging process in accordance with an embodiment of the invention.

FIG. 3 illustrates, generally, an isometric view of package 100 during a subsequent step of the packaging process. More specifically, FIG. 3 illustrates several semiconductor chips or die 341 and 342, where each of die 341 are located between two of die 342. In one embodiment, package 100 includes only a single die 341, and in a different embodiment, package 100 includes only a single die 341 and a single or multiple die 342. In an embodiment having multiple die, the relative locations of the die may vary from the locations illustrated in FIG. 3.

Die 341 are active die, each of which have at least one active device. As an example, the active device can be a high power transistor that dissipates greater than approximately ten watts, a high frequency transistor operating a frequency greater than approximately three hundred MHz, or a high power and high frequency transistor. Die 341 can also be devoid of or without any passive devices. In the same or a different embodiment, die 342 are passive die, each of which have at least one passive device. As an example, the passive device can be a capacitor, resistor, inductor, or the like. Die 342 can also be devoid of or without any active devices.

In this multi-die configuration having separate active die packaged together with high frequency matching or passive components, the high frequency performance of the component can be improved by reducing the detrimental effects of lossy silicon without sacrificing additional space within the final product and while maintaining industry standard package outlines. The multi-die configuration can also improve the high frequency performance of the component by including multiple matching stages to obtain a higher Q factor and improved impedance. The multi-die configuration can further improve the electrical performance of the component by spreading out the die layout over flange 110 to improve the heat dissipation from the die, particularly when the power density is high, and with the improved heat dissipation, the active devices or transistors can have shorter finger lengths and more fingers to achieve the same output power. Finally, the multi-die configuration can shorten the design cycle time over that of integrated circuit, single die solutions.

Die 341 and 342 can comprise different materials or the same materials with the same or different orientations. For example, die 341 can comprise silicon for active devices, and die 342 can comprise gallium arsenide or other substrate materials for passive structures. To improve the high frequency performance of the component, die 341 can be thinned to approximately one to four mils or approximately twenty-five to one hundred micrometers.

Die 341 and 342 are coupled to the top surface of flange 110 using a lead-free die attach 350. As an example, die attach 350 can comprise a metallurgical die attach material, such as gold silicon, having a melting temperature greater than approximately 250 degrees Celsius. As another example, die attach 350 can comprise gold tin or the like. In a different embodiment where die 341 and 342 are comprised of different materials, one lead-free metallurgical die attach material can be used to couple die 341 to flange 110, and a different die attach material can be used to couple die 342 to flange 110. As an example, the different die attach material can be a non-metallurgical die attach material.

Figure 4:
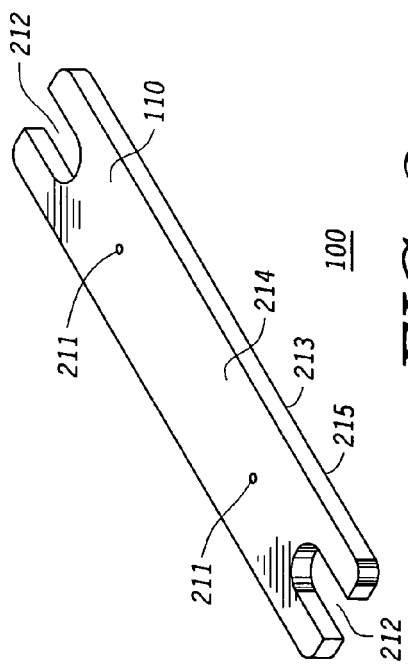
FIG. 4 illustrates an isometric view of the package of FIG. 3 during a later step of the packaging process in accordance with an embodiment of the invention.

FIG. 4 illustrates an isometric view of package 100 during a later step of the packaging process. More specifically, FIG. 4 illustrates a leadframe 120 having leads 421, tie bars, dam bars, and the like. In one embodiment, leadframe 120 comprises copper and other non-precious metals to lower the cost of package 100.

After coupling die 341 and 342 to flange 110, leadframe 120 and flange 110 are coupled together using a staking process. As an example, the staking process can be a high precision mechanical staking process, laser joining process, or spot welding process. As an example of a high precision mechanical staking process, stakes 460 can be inserted into holes in leadframe 120 and in features 211 of flange 110 to precisely couple together leadframe 120 and flange 110. In one embodiment, features 211 can be electrically insulated such that after the staking process, leadframe 120 and flange 110 remain or are kept electrically isolated from each other. In a different embodiment, stakes 460 can be electrically insulated to accomplish the same function. In another embodiment where features 211 are protrusions extending from the top surface of flange 110, the staking process can include inserting the protrusions into the holds in leadframe 120. The high precision staking process can attach leadframe 120 to flange 110 to within an accuracy of at least approximately +/−1 mils or +/−25.4 micrometers.

When flange 110 comprises layers or materials 213 and 214, the staking process can also stake materials 213 and 214 together such that, prior to the staking, materials 213 and 214 are separate layers and such that, after the staking, materials 213 and 214 are joined together. In another embodiment, stakes 460 can be used to first join together materials 213 and 214, and later, stakes 460 can be used to precisely align and attach leadframe 120 to flange 110.

In the same or a different embodiment, after the staking process, leadframe 120 and flange 110 are non-coplanar with each other. For example, a bottom surface of leadframe 120 can be non-coplanar with the bottom surface of flange 110, and a top surface of leadframe 120 can be non-coplanar with the top surface of flange 110, as illustrated in FIG. 4.

FIG. 4 also illustrates an interconnect structure 470. As an example, interconnect structure 470 can comprise wire bonds. In this example, the wire bonds can comprise aluminum when die 341 are comprised of silicon, and the wire bonds can comprise gold when die 341 are comprised of gallium arsenide. In the preferred embodiment, package 100 contains a single type of wire bond, but package 100 can contain different types of wire bonds when die 341 and 342 comprise different substrate materials. In a different embodiment, interconnect structure 470 can comprise tape automated bonding (TAB) or ribbon bonding. Interconnect structure 470 electrically interconnects die 341 and 342 to each other and to leads 421 of leadframe 120. In one embodiment, interconnect structure 470 can also electrically interconnect one or more of die 341 and 342 and/or leads 421 of leadframe 120 to flange 110.

Figure 5:
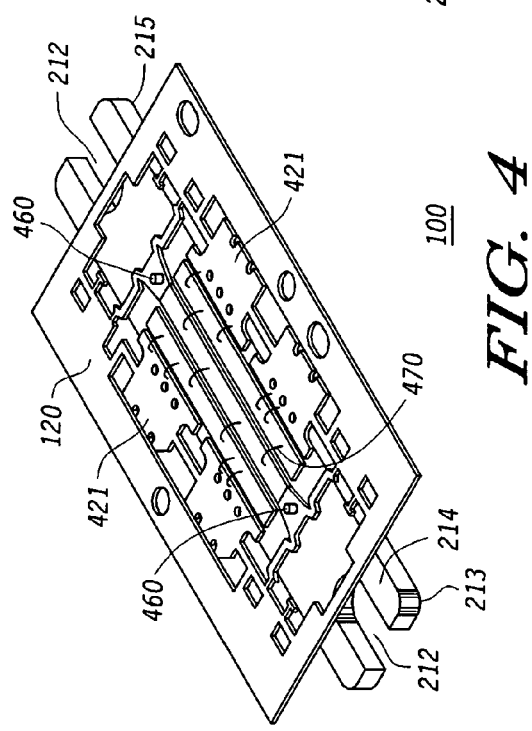
FIG. 5 illustrates a partial cross-sectional, isometric view of the package of FIG. 4 during an even later step of the packaging process in accordance with an embodiment of the invention.

FIG. 5 illustrates a partial cross-sectional, isometric view of package 100 during an even later step of the packaging process. More specifically, FIG. 5 illustrates a plastic material 130. As an example, plastic material 130 can comprise a glass-filled epoxy-based plastic and can reinforce or improve the strength of package 100 that is provided by flange 110. In one embodiment, plastic material 130 can be molded over flange 110, die 341 and 342 (FIG. 3), leadframe 120, interconnect structure 470 (FIG. 4). More specifically, plastic material 130 can be overmolded over a portion of flange 110, die 341 and 342, portions of leadframe 120, interconnect structure 470. In one embodiment, regardless of whether features 211 are through-holes or protrusions, features 211 (and stakes 460, when used) can serve as mold locks to improve the adhesion of plastic material 130 to flange 110.

In the same or a different embodiment where the bottom surface of flange 110 has recess 215, plastic material 130 can also be molded over the sides of flange 110 and in recess 215 (underneath flange 110) to further improve the adhesion of plastic material 130 to flange 110 and to make package 100 a surface-mount component. In a different embodiment, plastic material 130 is not molded over the sides of flange 110 or in recess 215, if any. In this different embodiment, the sides of flange 110 remain substantially exposed.

Next, leadframe 120 can be singulated by cutting the tie and dam bars of leadframe 120 such that leads 421 are no longer electrically coupled together by leadframe 120. In an embodiment where flange 110 was part of a different leadframe, flange 110 can also be singulated at this time from the other flanges in the different leadframe. Finally, leads 421 can be bent into a desired configuration.

Figure 6:
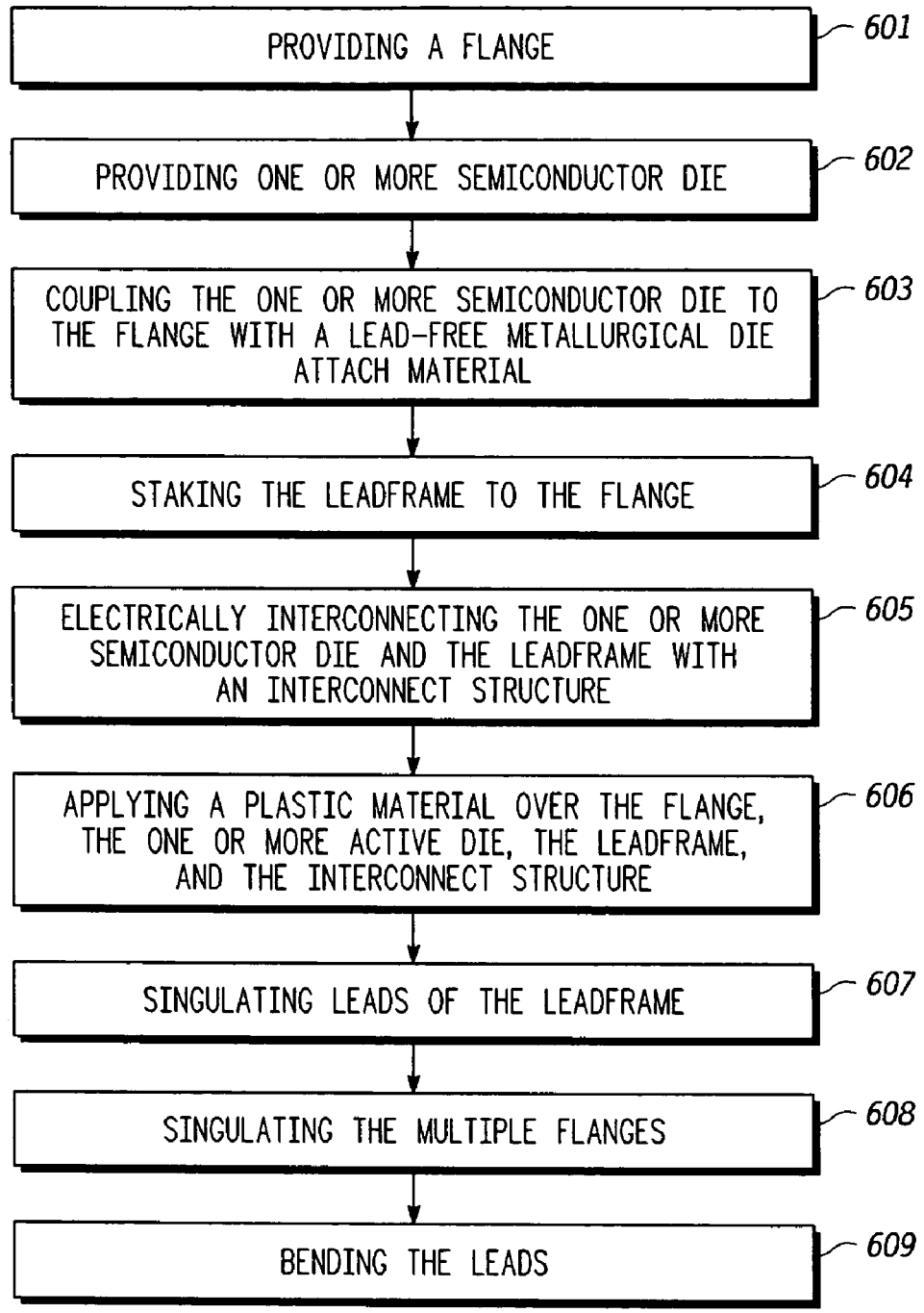
FIG. 6 illustrates a flow chart of a method of assembling a semiconductor structure or semiconductor packaging system in accordance with an embodiment of the invention.

FIG. 6 illustrates a flow chart of a method 600 of packaging a semiconductor die. In general, according to an embodiment of the invention, method 600 includes the steps of providing a flange, coupling one or more active die to the flange with a lead-free metallurgical die attach material, staking a leadframe to the flange after coupling the one or more active die to the flange, electrically interconnecting the one or more active die and the leadframe with an interconnect structure, and applying a plastic material over the flange, the one or more active die, the leadframe, and the interconnect structure.

More specifically, as illustrated in FIG. 6, method 600 includes a step 601 for providing a flange. As an example, the flange of step 601 can be similar to flange 110 in FIG. 2, and the flange of step 601 can have one or more of features 211 and 212 and recesses 215 and can also have one or more of materials 213 and 214, among other characteristics. Additionally, the flange of step 610 can be part of a leadframe having multiple flanges, as described for flange 110 in FIG. 2.

As also previously described for flange 110, the flange of step 601 in FIG. 6 can be selectively plated to provide a portion of the top surface of the flange to be suitable for a subsequent die attach step. In one embodiment, this selectively plating step can be part of step 601.

Method 600 in FIG. 6 also includes a step 602 for providing one or more semiconductor die. As an example, the die of step 602 can be similar to one or more of die 341 and/or 342 in FIG. 3. One skilled in the art will understand that the sequence of steps 601 and 602 can be interchanged with each other.

Returning to FIG. 6, method 600 includes a step 603 is for coupling the one or more semiconductor die to the flange with a lead-free metallurgical die attach material. As an example, the die attach material of step 603 can be similar to die attach 350 in FIG. 3. In one embodiment, step 603 is performed in a heated chamber or on a heated support surface, and the semiconductor die are scrubbed against the flange, or vice versa, during the coupling process to improve the precision of the location of the die.

In the same or a different embodiment, the die attach material can be plated or otherwise deposited on the back surface of the semiconductor die during the manufacturing process of the semiconductor die and before the semiconductor die is singulated from a wafer. This process is preferred over using a perform and other techniques known in the art because this process improves the thermal conductivity compared to the use of performs due to the fact that the die attach material can be thinner and can have a lower thermal resistivity than that of performs. As described previously, in one embodiment, different die attach material can be used for different semiconductor die.

Next, after step 603, method 600 continues with a step 604 for staking the leadframe to the flange. As an example, the staking step or process can be similar to that described previously with reference leadframe 120 in FIG. 4. In the preferred embodiment, step 604 occurs at a relatively lower temperature compared to other leadframe attachment processes.

Also in the preferred embodiment, step 604 occurs after step 603. Using these two particular steps in this particular sequence, the die attach material of step 603 can have a lower melting temperature than in prior art methods, which enables the use of a wider range of materials for the die attach material. Also, the leadframe and the die can be positioned relative to each other with improved precision such that the length of the subsequent electrical interconnect structure (i.e., wire bonds) is more consistent for more precise parasitic inductance from the interconnect structure, which results in improved high frequency performance.

Method 600 also includes a step 605 for electrically interconnecting the one or more semiconductor die and the leadframe with an interconnect structure. As an example, the interconnect structure can be similar to interconnect structure 470 in FIG. 4. In one embodiment, step 605 can include electrically interconnecting the one or more semiconductor die with the flange, as explained previously for interconnect structure 470 in FIG. 4. In the same or a different embodiment, steps 604 and 605 can occur simultaneously with each other.

Next, after step 605, method 600 continues with a step 606 for overmolding or otherwise applying a plastic material over the flange, the one or more active die, the leadframe, and the interconnect structure. As an example, the plastic material of step 606 can be similar to plastic material 130 in FIG. 5. In one embodiment, the semiconductor die can be coated or otherwise passivated before step 606.

Then, method 600 continues with a step 607 for singulating leads of the leadframe, as described previously with respect to leads 421 of leadframe 120 in FIG. 5, and in one embodiment, method 600 can also include a step 608 for singulating the multiple flanges from each other. Step 608 can occur before, after, or simultaneously with step 607.

As illustrated in FIG. 6, method 600 also includes a step 609 for bending the leads into a pre-determined shape. The bending process of step 609 can include forming the leads into the pre-determined shape. As an example, step 609 can form the leads to create a package that is a surface mount package.

Although the invention has been described with reference to specific embodiments, it will be understood by those skilled in the art that various changes may be made without departing from the spirit or scope of the invention. Various examples of such changes have been given in the foregoing description. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the configuration, geometry, shape, and size of recess 211 in FIG. 2 may vary, and that the foregoing discussion of certain of these embodiments does not necessarily represent a complete description of all possible embodiments. Similarly, the material compositions of the various elements of package 100 may vary from the details described above.

All elements claimed in any particular claim are essential to the invention claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method of packaging a semiconductor die comprising:
    providing a flange;
    coupling one or more active die to the flange with a metallurgical material;
    after coupling the one or more active die to the flange, mechanically staking a leadframe to the flange;
    using wire bonds to electrically interconnect the one or more active die and the leadframe; and
    overmolding a plastic material over at least a portion of the flange, the one or more active die, a portion of the leadframe, and the wire bonds,
wherein:
    providing the flange further comprises:
        providing the flange comprised of a first material and a second material;
    the first material is more ductile and thermally conductive than the second material;
    the second material is more rigid than the first material; and
    the first material is closer to the one or more active die than the second material.

2. The method of claim 1 wherein:
    providing die flange further comprises:
        providing multiple flanges coupled together in a leadframe-type structure.

3. The method of claim 1 further comprising:
    after coupling the one or more active die to the flange, electrically isolating the leadframe from the flange.

4. The method of claim 3 wherein:
    providing the flange further comprises:
        providing multiple flanges coupled together in a leadframe-type structure.

5. The method of claim 4 wherein
    the flange comprises:
        a top surface;
        a bottom surface opposite the top surface; and
        two or more side surfaces coupling the top surface to the bottom surface; and
    overmolding the plastic material comprises:
        overmolding the plastic material over at least a portion of the top surface of the flange, at least a portion of at least one of the two or more side surfaces of the flange, the one or more active die, the leadframe, and the wire bonds.

6. The method of claim 5 wherein:
providing the flange further comprises:
   providing the flange with at least one feature; and
mechanically staking a leadframe to the flange further comprises:
   mechanically staking the leadframe to the at least one feature of the flange.

7. The method of claim 6 wherein:
providing the flange with the at least one feature comprises:
   providing the flange with a protrusion; and
the at least one feature comprises the protrusion.

8. The method of claim 1 wherein
the flange comprises:
   a top surface:
   a bottom surface opposite the top surface; and
   two or more side surfaces coupling the top surface to the bottom surface; and
overmolding the plastic material comprises:
   overmolding the plastic material over at least a portion of the top surface of the flange, at least a portion of at least of one of the two or more side surfaces of the flange, the one or more active die, the leadframe, and the wire bonds.

9. The method of claim 1 wherein:
providing the flange further comprises:
   providing the flange with at least one feature; and
mechanically staking a leadframe to the flange further comprises:
   mechanically staking the leadframe to the at least one feature of the flange.

10. The method of claim 9 wherein:
providing the flange with the at least one feature comprises:
   providing the flange with a protrusion; and
   the at least one feature comprises the protrusion.

11. The method of claim 1 further comprising:
after coupling the one or more active die to the flange, electrically isolating the leadframe from the flange,
wherein:
   providing the flange further comprises:
      providing the flange with at least one feature; and
   mechanically staking a leadframe to the flange further comprises:
      mechanically staking the leadframe to the at least one feature of the flange.

12. A method of packaging a semiconductor die comprising:
   providing a flange;
   coupling one or more active die to the flange with a metallurgical material;
   after coupling the one or more active die to the flange, meet mechanically staking a leadframe to the flange;
   using wire bonds to electrically interconnect the one or more active die and the leadframe; and
   overmolding a plastic material over at least a portion of the flange, the one or more active die, a portion of the leadframe, and the wire bonds,
wherein:
   providing the flange further comprises:
      providing flange comprised of a first material and a second material;
      the first material is more ductile and thermally conductive than the second material;
      the second material is more rigid than the first material;
      the first material is closer to the one or more active die than the second material;
   mechanically staking the leadframe to the flange further comprises:
      mechanically staking the first and second materials of the flange together such that the leadframe and the flange are non-coplanar with each other.

13. The method of claim 12 wherein:
providing the flange further comprises:
   providing multiple flanges coupled together in a leadframe-type structure.

14. The method of claim 12 further comprising:
after coupling the one or more active die to the flange, electrically isolating the leadframe from the flange.

15. The method of claim 12 wherein
the flange comprises:
   a top surface;
   a bottom surface opposite the top surface; and
   two or more side surfaces coupling the top surface to the bottom surface; and
overmolding the plastic material comprises:
   overmolding the plastic material over at least a portion of the top surface of the flange, at least a portion of at least of one of the two or more side surfaces of the flange, the one or more active die, the leadframe, and the wire bonds.

16. The method of claim 12 wherein:
providing the flange further comprises:
   providing the flange with at least one feature; and
mechanically staking a leadframe to the flange further comprises:
   mechanically staking the leadframe to the at least one feature of the flange.

17. The method of claim 16 wherein:
providing the flange with the at least one feature comprises:
   providing the flange with a protrusion; and
the at least one feature comprises the protrusion.

18. The method of claim 17 wherein:
providing the flange further comprises:
   providing multiple flanges coupled together in a leadframe-type structure.

19. The method of claim 18 further comprising:
after coupling the one or more active die to the flange, electrically isolating the leadframe from the flange.

20. The method of claim 19 wherein
the flange comprises:
   a top surface;
   a bottom surface opposite the top surface; and
   two or more side surfaces coupling the top surface to the bottom surface; and
overmolding the plastic material comprises:
   overmolding the plastic material over at least a portion of the top surface of the flange, at least a portion of at least of one of the two or more side surfaces of the flange, the one or more active die, the leadframe, and the wire bonds.

* * * * *

UNITED STATES PATENT AND TRADEMARK OFFICE
CERTIFICATE OF CORRECTION

PATENT NO. : 7,445,967 B2  
APPLICATION NO. : 11/336368  
DATED : November 4, 2008  
INVENTOR(S) : Abdo et al.

Page 1 of 1

It is certified that error appears in the above-identified patent and that said Letters Patent is hereby corrected as shown below:

Column 8, line 45, in Claim 2, delete "die" and insert -- the --.

Column 9, line 14, in Claim 8, delete "surface:" and insert -- surface; --.

Column 9, lines 50-51, in Claim 12, delete "flange, meet mechanically" and insert -- flange, mechanically --.

Column 9, line 59, in Claim 12, delete "providing flange" and insert -- providing the flange --.

Signed and Sealed this
Twelfth Day of April, 2011

David J. Kappos
*Director of the United States Patent and Trademark Office*